(12) United States Patent
Chao et al.

(10) Patent No.: US 11,705,725 B2
(45) Date of Patent: Jul. 18, 2023

(54) INTEGRATED CIRCUIT WITH ELECTROSTATIC DISCHARGE PROTECTION

(71) Applicant: RichWave Technology Corp., Taipei (TW)

(72) Inventors: Chuan-Chen Chao, Taipei (TW); Ching-Yao Pai, Taipei (TW)

(73) Assignee: RichWave Technology Corp., Taipei (TW)

( * ) Notice: Subject to any disclaimer, the term of this patent is extended or adjusted under 35 U.S.C. 154(b) by 428 days.

(21) Appl. No.: 17/083,323

(22) Filed: Oct. 29, 2020

(65) Prior Publication Data

US 2021/0135451 A1    May 6, 2021

Related U.S. Application Data

(60) Provisional application No. 62/929,112, filed on Nov. 1, 2019.

(30) Foreign Application Priority Data

Oct. 14, 2020 (TW) ................. 109135417

(51) Int. Cl.
    *H02H 9/04* (2006.01)
    *H01L 27/02* (2006.01)

(52) U.S. Cl.
    CPC ......... *H02H 9/046* (2013.01); *H01L 27/0255* (2013.01); *H01L 27/0266* (2013.01); *H01L 27/0288* (2013.01)

(58) Field of Classification Search
    CPC .................. H02H 9/046; H01L 27/0248–0296
    See application file for complete search history.

(56) References Cited

U.S. PATENT DOCUMENTS

| | | | |
|---|---|---|---|
| 7,660,087 B2 * | 2/2010 | Huang | H02H 9/046 361/56 |
| 9,214,806 B1 | 12/2015 | Huang | |
| 10,269,833 B2 | 4/2019 | Kimura | |

(Continued)

FOREIGN PATENT DOCUMENTS

| | | |
|---|---|---|
| CN | 103795026 B | 8/2016 |
| EP | 0 735 687 A2 | 10/1996 |

(Continued)

*Primary Examiner* — Jared Fureman
*Assistant Examiner* — Christopher J Clark
(74) *Attorney, Agent, or Firm* — Winston Hsu

(57) ABSTRACT

An integrated circuit includes a signal pad, receiving an input signal during a normal mode, and receive an ESD signal during an ESD mode; an internal circuit, processing the input signal during the normal mode; a variable impedance circuit, comprising a first end coupled to the signal pad, a second end coupled to the internal circuit, wherein the variable impedance circuit provides a low or high impedance path between the signal pad and the internal circuit during the normal or ESD mode; and a switch circuit, comprising a first end coupled to a control end of the variable impedance circuit, a second end coupled to a reference voltage terminal, and a control end receiving a node voltage, wherein the switch circuit switches the control end of the variable impedance circuit to have a first specific voltage or be electrically floating during the normal or ESD mode.

20 Claims, 10 Drawing Sheets

(56) References Cited

U.S. PATENT DOCUMENTS

| | | | |
|---|---|---|---|
| 2007/0047164 A1* | 3/2007 | Biagi | G11C 5/005 |
| | | | 361/78 |
| 2008/0316660 A1 | 12/2008 | Huang | |
| 2009/0091870 A1* | 4/2009 | Huang | H02H 9/046 |
| | | | 361/56 |
| 2011/0063762 A1 | 3/2011 | Lee | |
| 2013/0050887 A1 | 2/2013 | Fan | |
| 2018/0158814 A1 | 6/2018 | Salcedo | |
| 2018/0159323 A1* | 6/2018 | Huang | H02H 9/046 |

FOREIGN PATENT DOCUMENTS

| | | |
|---|---|---|
| JP | 3983067 | 9/2007 |
| TW | 201039350 | 11/2010 |
| TW | 201607197 A | 2/2016 |
| TW | 201906268 A | 2/2019 |

* cited by examiner

INTEGRATED CIRCUIT WITH ELECTROSTATIC DISCHARGE PROTECTION

CROSS REFERENCE TO RELATED APPLICATION

This application claims the benefits of U.S. Provisional Application No. 62/929,112, filed on Nov. 1, 2019 and entitled "Integrated Circuit Using Block Circuit for Reducing Electrostatic Discharge Current/Voltage" and Taiwan Patent Application No. 109135417, filed on Oct. 14, 2020, at the Taiwan Intellectual Property Office, the contents of which are incorporated herein by reference.

TECHNICAL FIELD

The present invention relates to an integrated circuit (IC) with electrostatic discharge (ESD) protection, and more particularly, to an IC with ESD protection having smaller circuit area and parasitic capacitance.

BACKGROUND

Electrostatic discharge (ESD) protective capability test is used to evaluate reliability of an integrated circuit (IC). To prevent strong ESD signal from entering an internal circuit of the IC and causing damage, an ESD protection device is commonly disposed in the IC to provide a discharge path for the ESD signal. However, a voltage generated by conduction resistance of the ESD protection device and the ESD signal may exceed a maximum tolerable voltage of the internal circuit, and thus damage the internal circuit. Thus, conventional techniques typically increases a circuit size of the ESD protection device (e.g., increased to be 3 times the original circuit size), to reduce the conduction resistance of the ESD protection device and improve ESD signal discharge capability of the ESD protection device.

However, increasing the circuit size of the ESD protection device not only occupies more circuit area of the IC, but also requires higher production costs. In addition, the ESD protection device with a larger circuit size has relatively greater parasitic capacitance, thereby reducing a switching speed of the internal circuit. In view of this, it is necessary to improve the conventional technology.

SUMMARY

It is therefore an objective of the present invention to provide an IC with ESD protection having smaller circuit area and parasitic capacitance.

The present invention discloses an integrated circuit (IC) with electrostatic discharge (ESD) protection. The IC includes a signal pad, configured to receive an input signal during a normal mode, and receive an ESD signal during an ESD mode; an internal circuit, configured to process the input signal during the normal mode; a variable impedance circuit, comprising a first end coupled to the signal pad, a second end coupled to the internal circuit, and a control end, wherein the variable impedance circuit provides a low impedance path between the signal pad and the internal circuit during the normal mode, and provides a high impedance path between the signal pad and the internal circuit during the ESD mode; and a switch circuit, comprising a first end coupled to the control end of the variable impedance circuit, a second end coupled to a reference voltage terminal, and a control end configured to receive a node voltage, wherein the switch circuit is configured to switch the control end of the variable impedance circuit to have a first specific voltage during the normal mode, and to switch the control end of the variable impedance circuit to be electrically floating during the ESD mode.

DETAILED DESCRIPTION

Figure 1:
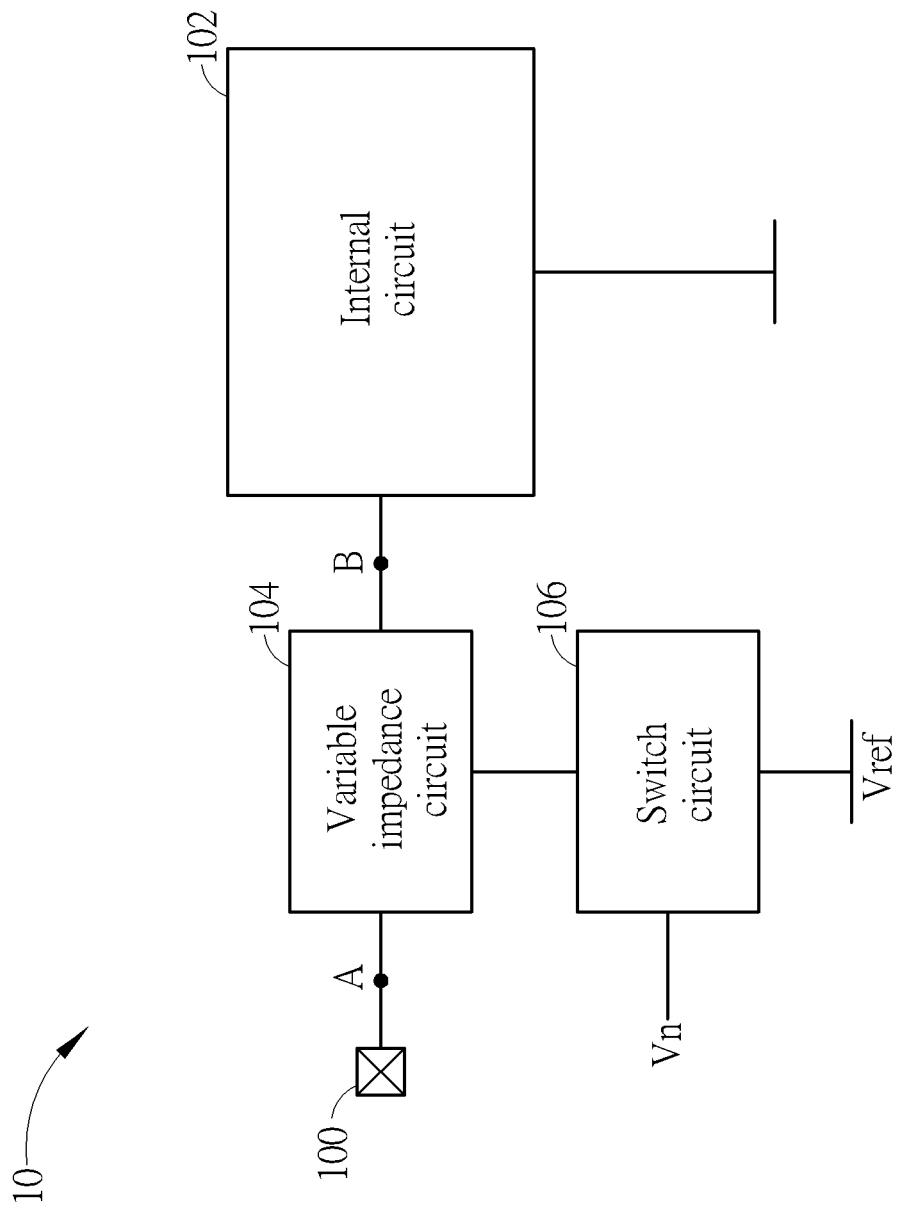
FIG. 1 is a schematic diagram of an IC according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIG. 1, which is a schematic diagram of an integrated circuit (IC) 10 according to an embodiment of the present invention. The IC 10 has a mechanism of electrostatic discharge (ESD) protection. The IC 10 includes a signal pad 100, an internal circuit 102, a variable impedance circuit 104 and a switch circuit 106. The signal pad 100 receives an input signal during a normal mode, and receives an ESD Signal during an ESD mode. The input signal may be a direct current (DC) voltage or an alternating current (AC) voltage, and the ESD signal may be an ESD current or an ESD voltage. The internal circuit 102 processes the input signal during the normal mode. The variable impedance circuit 104 includes a first end coupled to the signal pad 100, a second end coupled to the internal circuit 102, and a control end. The variable impedance circuit 104 provides a low impedance path between the signal pad 100 and the internal circuit 102 during the normal mode, and provides a high impedance path between the signal pad 100 and the internal circuit 102 during the ESD mode. The switch circuit 106 includes a first end coupled to the control end of the variable impedance circuit 104, a second end coupled to a reference voltage terminal, and a control end for receiving a node voltage Vn. The switch circuit 106 switches the control end of the variable impedance circuit 104 to have a first specific voltage during the normal mode, and switches the control end of the variable impedance circuit 104 to be electrically floating during the ESD mode. In addition, a reference voltage Vref is applied to the reference voltage terminal, the reference voltage Vref may be a ground voltage (e.g., 0 volt), or other fixed voltages with a low voltage level.

A node A may be formed between the signal pad 100 and the first end of the variable impedance circuit 104. A node B may be formed between the second end of the variable impedance circuit 104 and the internal circuit 102. In other words, under the normal mode, the low impedance path provided by the variable impedance circuit 104 between the node A and the node B is equivalent to a transmission path from the signal pad 100 to the internal circuit 102 provided for the input signal, so that the internal circuit 102 may normally receive and process the input signal. On the other hand, under the ESD mode, the high impedance path provided by the variable impedance circuit 104 between the node A and the node B is equivalent to increase difficulty of transmitting the ESD signal from the signal pad 100 to the internal circuit 102 (e.g., the high impedance path is equivalent to provide additional tolerable capability of the ESD signal for the internal circuit 102, so as to block the ESD signal from entering the internal circuit 102). Therefore, the ESD signal is significantly reduced from the node A to the node B, and thus it is difficult for the ESD signal to directly enter the internal circuit 102, thereby preventing the internal circuit 102 from being damaged. As a result, the present invention may properly design circuitry, so that operations of the internal circuit 102 are not affected under the normal mode, and impact of the ESD signal on the internal circuit 102 may be reduced under the ESD mode. Besides, the present invention may properly design the circuit size of the variable impedance circuit 104, to have smaller circuit area (e.g., an area occupied by the variable impedance circuit 104 in the entire circuit area of the IC 10 is less than 0.5%) and parasitic capacitance. Smaller parasitic capacitance during the normal mode facilitates maintaining integrity of the input signal and improves impact on a switching speed of the internal circuit 102.

In detail, during the normal mode, an absolute value of a voltage difference between the node voltage Vn and a voltage of the first end or the second end of the switch circuit 106 is greater than an absolute value of a threshold voltage of the switch circuit 106 to switch the switch circuit 106 to be conducted. The conducted switch circuit 106 may switch the control end of the variable impedance circuit 104 to be electrically coupled to the reference voltage terminal to have a first specified voltage (e.g., near the reference voltage Vref of the reference voltage terminal), so that the variable impedance circuit 104 provides the low impedance path. On the other hand, during the ESD mode, the absolute value of the voltage difference between the node voltage Vn and the voltage of the first end or the second end of the switch circuit 106 is smaller than the absolute value of the threshold voltage of the switch circuit 106 to switch the switch circuit 106 to be cutoff. The cutoff switch circuit 106 may switch the control end of the variable impedance circuit 104 to be electrically floating, so that the variable impedance circuit 104 provides the high impedance path. It should be noted that the node voltage Vn may be related to whether the internal circuit 102 is in a power on status or a power off status, or may be provided by other circuits. Those skilled in the art may make modifications or alterations accordingly, but not limited to this.

Figure 2:
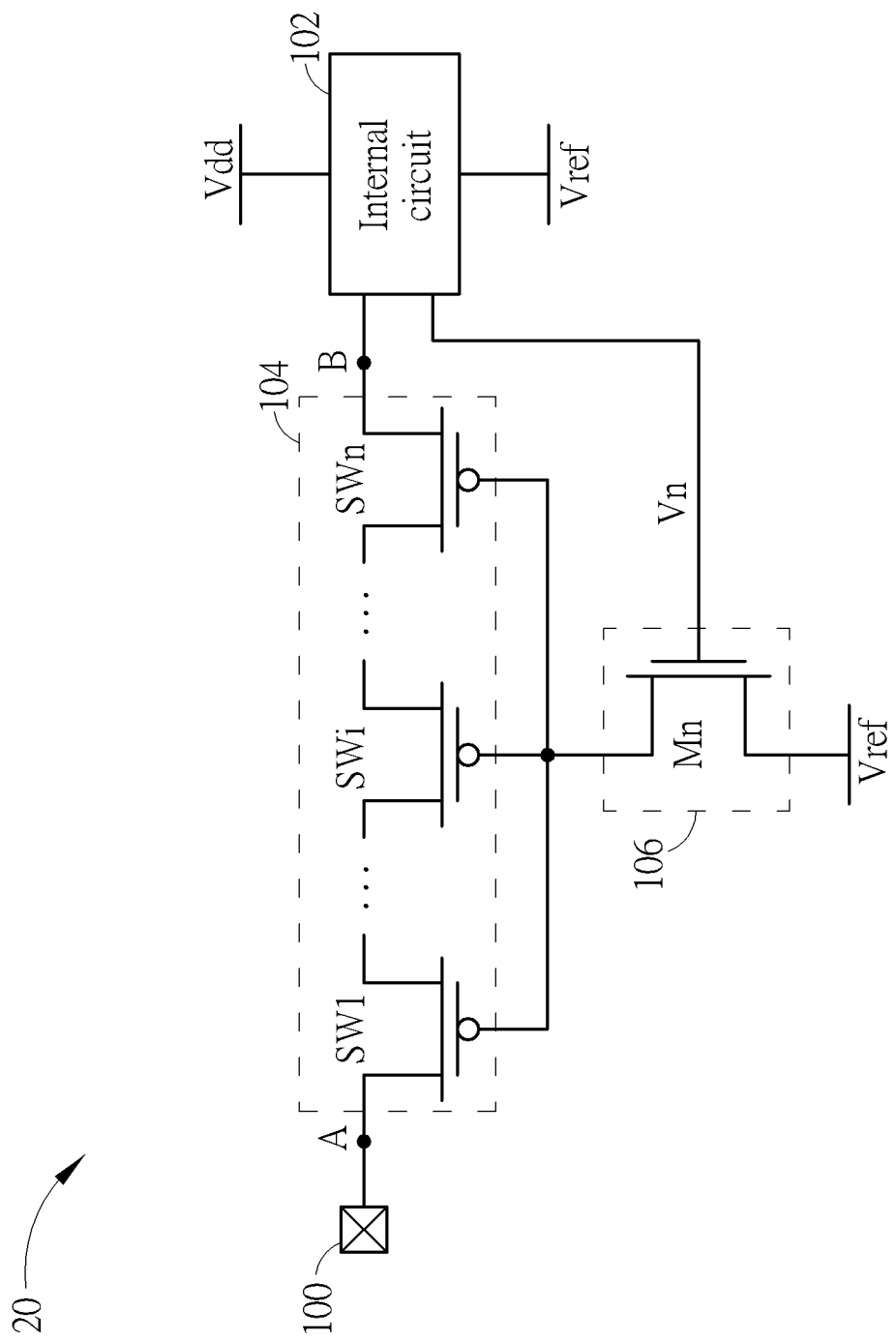
FIG. 2 is a schematic diagram of another IC according to an embodiment of the present invention.

Specifically, please refer to FIG. 2, which is a schematic diagram of another IC 20 according to an embodiment of the present invention. The variable impedance circuit 104 may include at least one switch. Notably, the number of the at least one switch is relevant to ESD protection capability of the IC 20. In other words, the variable impedance circuit 104 is flexible in design. Furthermore, it may be designed that the number of the at least one switch and the ESD protection capability of the IC 20 are positively correlated. The embodiment in FIG. 2 takes the variable impedance circuit 104 including n switches SW1-SWn as an example. The n switches SW1-SWn may form a stack structure. In detail, a switch SW1 has a first end coupled to the first end of the variable impedance circuit 104, a second end coupled to the second end of the variable impedance circuit 104, and a control end coupled to the control end of the variable impedance circuit 104. The switch SW1 includes a first end coupled to the first end of the variable impedance circuit 104, a second end coupled to a first end of the switch SWi, and a control end coupled to the control end of the variable impedance circuit 104. The switch SWn includes a first end coupled to the second end of the switch SWi, a second end coupled to the second end of the variable impedance circuit 104, and a control end coupled to the control end of the variable impedance circuit 104. Variables n and i are positive integers, and $1<i<n$. Each of the switches SW1-SWn may include a P-channel metal oxide semiconductor (PMOS) transistor, a P-channel field effect transistor (PFET) or a pseudomorphic high electron mobility transistor (pHEMT). Furthermore, the present invention may utilize the PMOS transistor, the PFET or the pHEMT with a smaller size, such that the variable impedance circuit 104 has smaller circuit area and parasitic capacitance. The embodiment in FIG. 2 is described by taking each of the switches SW1-SWn including a PMOS transistor as an example. The first ends of the switches SW1-SWn may be one of the drains and the sources of the PMOS transistors, the second ends of the switches SW1-SWn may be another of the drains and the sources of the PMOS transistors, and the control ends of the switches SW1-SWn may be the gates of the PMOS transistors.

As shown in FIG. 2, the control end of the switch circuit 106 is coupled to the internal circuit 102, the node voltage Vn is related to whether the internal circuit 102 is in a power on status or a power off status. The switch circuit 106 may include a PMOS transistor or an N-channel metal oxide semiconductor (NMOS) transistor. The embodiment in FIG. 2 is described by taking the switch circuit 106 including an NMOS transistor Mn as an example. The first end of the switch circuit 106 may be a drain of the NMOS transistor Mn, the second end of the switch circuit 106 may be a source of the NMOS transistor Mn, and the control end of the switch circuit 106 may be a gate of the NMOS transistor Mn.

During the normal mode, the internal circuit 102 is in the power on status, to switch the node voltage Vn to have a second specified voltage. That is, the reference voltage Vdd is applied to a high level reference voltage terminal of the internal circuit 102 and the reference voltage Vref is applied to the low level reference voltage terminal of the internal circuit 102, to provide power to the internal circuit 102, so that the internal circuit 102 may operate normally (e.g., for processing the input signal). The node voltage Vn is related to the power on status of the internal circuit 102 and has the second specified voltage because of normal operations of the internal circuit 102, so that an absolute value of a voltage difference between the node voltage Vn and a source voltage of the NMOS transistor Mn (or a gate-source voltage difference of the NMOS transistor Mn) is greater than an absolute value of a threshold voltage of the NMOS transistor Mn. Thus, the NMOS transistor Mn is conducted. As a result, the control ends of the switches SW1-SWn are electrically coupled to the reference voltage terminal with the reference voltage Vref and have a low voltage level, and the switches SW1-SWn are conducted accordingly, so that the variable impedance circuit 104 may provide the low impedance path between the signal pad 100 and the internal circuit 102.

On the other hand, during the ESD mode, the internal circuit 102 is in the power off status, to switch the node voltage Vn to have a floating voltage. That is, the reference voltage Vdd is not applied to the high level reference voltage terminal of the internal circuit 102, and the reference voltage Vref is not applied to the low level reference voltage terminal of the internal circuit 102. The high level reference voltage terminal and the low level reference voltage terminal of the internal circuit 102 are electrically floating, and the internal circuit 102 is not powered. The node voltage Vn is related to the power off status of the internal circuit 102 and has the floating voltage because the internal circuit 102 is not powered, so that the absolute value of the voltage difference between the node voltage Vn and the source voltage of the NMOS transistor Mn (or the gate-source voltage difference of the NMOS transistor Mn) is smaller than the absolute value of the threshold voltage of the NMOS transistor Mn. Thus, the NMOS transistor Mn is cutoff. As a result, the control ends of the switches SW1-SWn are electrical floating, and the switches SW1-SWn are cutoff accordingly, so that the variable impedance circuit 104 may provide the high impedance path between the signal pad 100 and the internal circuit 102. The floating voltage may have an unspecified voltage.

It is noted that, in other embodiments, when the switch circuit 106 includes a PMOS transistor, the first end of the switch circuit 106 may be a source of the PMOS transistor, the second end of the switch circuit 106 may be a drain of the PMOS transistor, and the control end of the switch circuit 106 may be a gate of the PMOS transistor. During the normal mode, the node voltage Vn also has a second specific voltage because of normal operations of the internal circuit 102, so that an absolute value of a voltage difference between the node voltage Vn and a source voltage of the PMOS transistor (or a source-gate voltage difference of the PMOS transistor) is greater than an absolute value of a threshold voltage of the PMOS transistor. Thus, the PMOS transistor is conducted. As a result, the control ends of the switches SW1-SWn are electrically coupled to the reference voltage terminal with the reference voltage Vref and have a low voltage level, and the switches SW1-SWn are conducted accordingly, so that the variable impedance circuit 104 may provide the low impedance path between the signal pad 100 and the internal circuit 102. On the other hand, during the ESD mode, the node voltage Vn has a floating voltage because the internal circuit 102 is not powered, so that the absolute value of the voltage difference between the node voltage Vn and the source voltage of the PMOS transistor (or the source-gate voltage difference of the PMOS transistor) is smaller than the absolute value of the threshold voltage of the PMOS transistor. Thus, the PMOS transistor is cutoff. As a result, the control ends of the switches SW1-SWn are electrical floating, and the switches SW1-SWn are cutoff accordingly, so that the variable impedance circuit 104 may provide the high impedance path between the signal pad 100 and the internal circuit 102.

Figure 3:
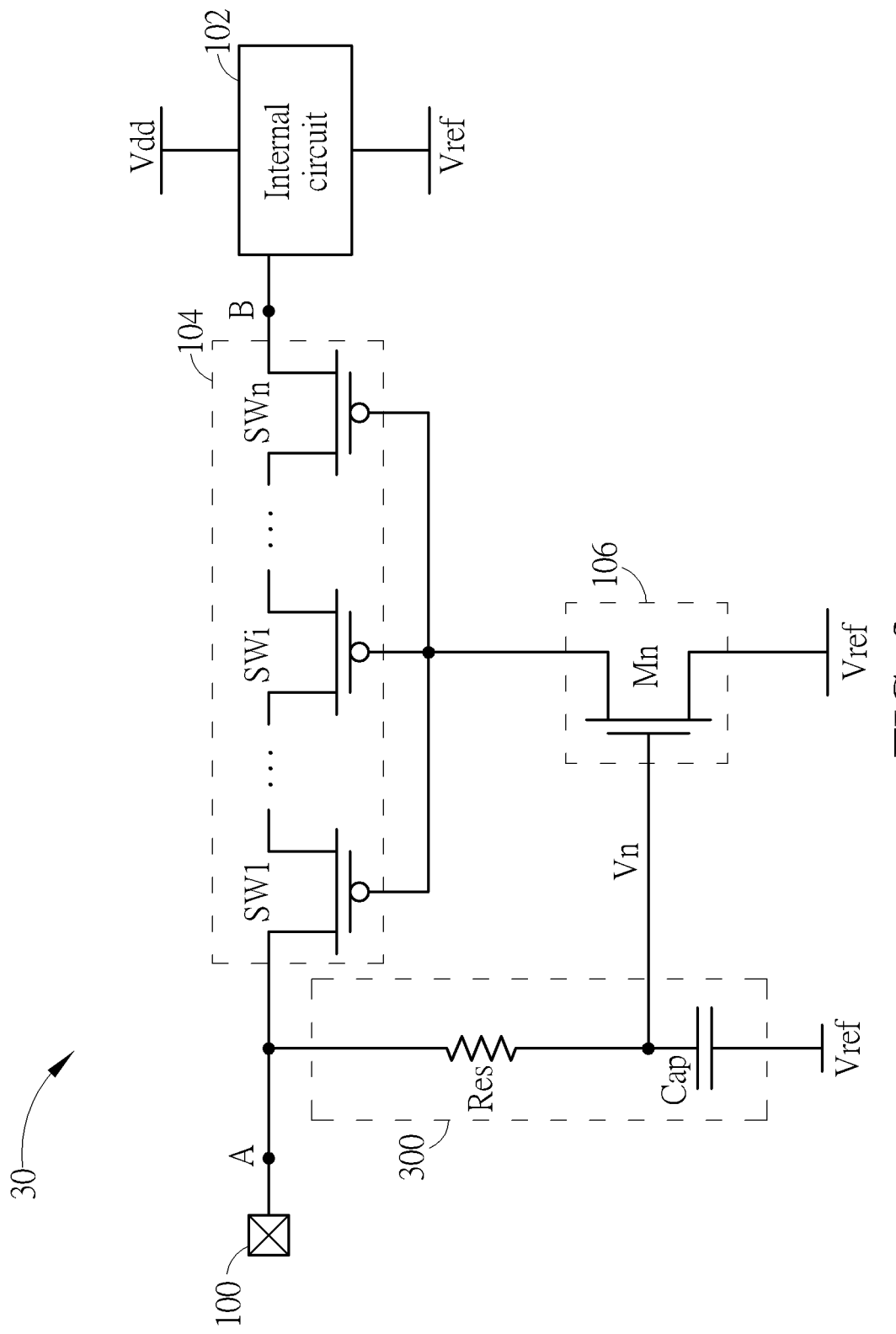
FIG. 3 is a schematic diagram of another IC according to an embodiment of the present invention.

Specifically, please refer to FIG. 3, which is a schematic diagram of another IC 30 according to an embodiment of the present invention. The IC 30 is substantially similar to the IC 20 shown in FIG. 2, and therefore elements with similar structures and functions are denoted by the same symbols. Main difference between the IC 30 and the IC 20 is that the IC 30 further includes an ESD detection circuit 300 for generating the node voltage Vn according to the input signal or the ESD signal. In detail, the ESD detection circuit 300 includes a first end coupled between the signal pad 100 and the first end of the variable impedance circuit 104, a second end coupled to the reference voltage terminal, and an output end coupled to the control end of the switch circuit 106 to output the node voltage Vn. The embodiment in FIG. 3 is described by taking the switch circuit 106 including an NMOS transistor Mn as an example. In this case, the ESD detection circuit 300 may include a resistor Res and a capacitor Cap. The resistor Res includes a first end coupled to the first end of the ESD detection circuit 300 and a second end coupled to the output end of the ESD detection circuit 300. The capacitor Cap includes a first end coupled to the second end of the resistor Res and a second end coupled to the second end of the ESD detection circuit 300. A time constant of the resistor Res and the capacitor Cap may be designed to be greater than a pulse width of the ESD signal and smaller than a switching time of the input signal (e.g., the time constant of the resistor Res and the capacitor Cap may be designed to be greater than 100 ns and smaller than 300 ns). In other embodiments, in a case that the internal circuit 102 itself includes a resistor and a capacitor connected in series between the node A and the reference voltage terminal, the resistor and the capacitor of the internal circuit 102 may be utilized as an ESD detection circuit. That is, the control end of the switch circuit 106 is coupled to the internal circuit 102, and shares the resistor and the capacitor with other elements in the internal circuit 102, so that the resistor Res and the capacitor Cap do not need to be additionally disposed outside of the internal circuit 102.

During the normal mode, the input signal comes from the signal pad 100 and passes the node A. Since the time constant of the resistor Res and capacitor Cap is designed to be less than the switching time of the input signal, the capacitor Cap is equivalent to an open circuit for the input signal. Therefore, the node voltage Vn is raised to near a voltage of the node A, and an absolute value of a voltage difference between the node voltage Vn and a source voltage of the NMOS transistor Mn (or a gate-source voltage difference of the NMOS transistor Mn) is greater than an absolute value of a threshold voltage of the NMOS transistor Mn, such that the NMOS transistor Mn is conducted. As a result, the control ends of the switches SW1-SWn are electrically coupled to the reference voltage terminal with the reference voltage Vref and have a low voltage level, and the switches SW1-SWn are conducted accordingly, so that the variable impedance circuit 104 may provide the low impedance path between the signal pad 100 and the internal circuit 102. Under the ESD mode, the ESD signal comes from the signal pad 100 and passes the node A, the capacitor Cap is equivalent to a short circuit for the ESD signal with high frequency, such that the node voltage Vn is pulled down to be near the reference voltage Vref of the reference voltage terminal. In other words, since the time constant of the resistor Res and the capacitor Cap are designed to be greater than the pulse width of the ESD signal, the node voltage Vn is pulled down to be near the reference voltage Vref of the reference voltage terminal within the pulse width of the ESD signal. Thus, the absolute value of the voltage difference between the node voltage Vn and the source voltage of the NMOS transistor Mn (or the gate-source voltage difference of the NMOS transistor Mn) is smaller than the absolute value of the threshold voltage of the NMOS transistor Mn, so that the NMOS transistor Mn is cutoff. As a result, the control ends of the switches SW1-SWn are electrically floating, and the switches SW1-SWn are cutoff accordingly, so that the variable impedance circuit 104 provides the high impedance path between the signal pad 100 and the internal circuit 102.

Figure 4:
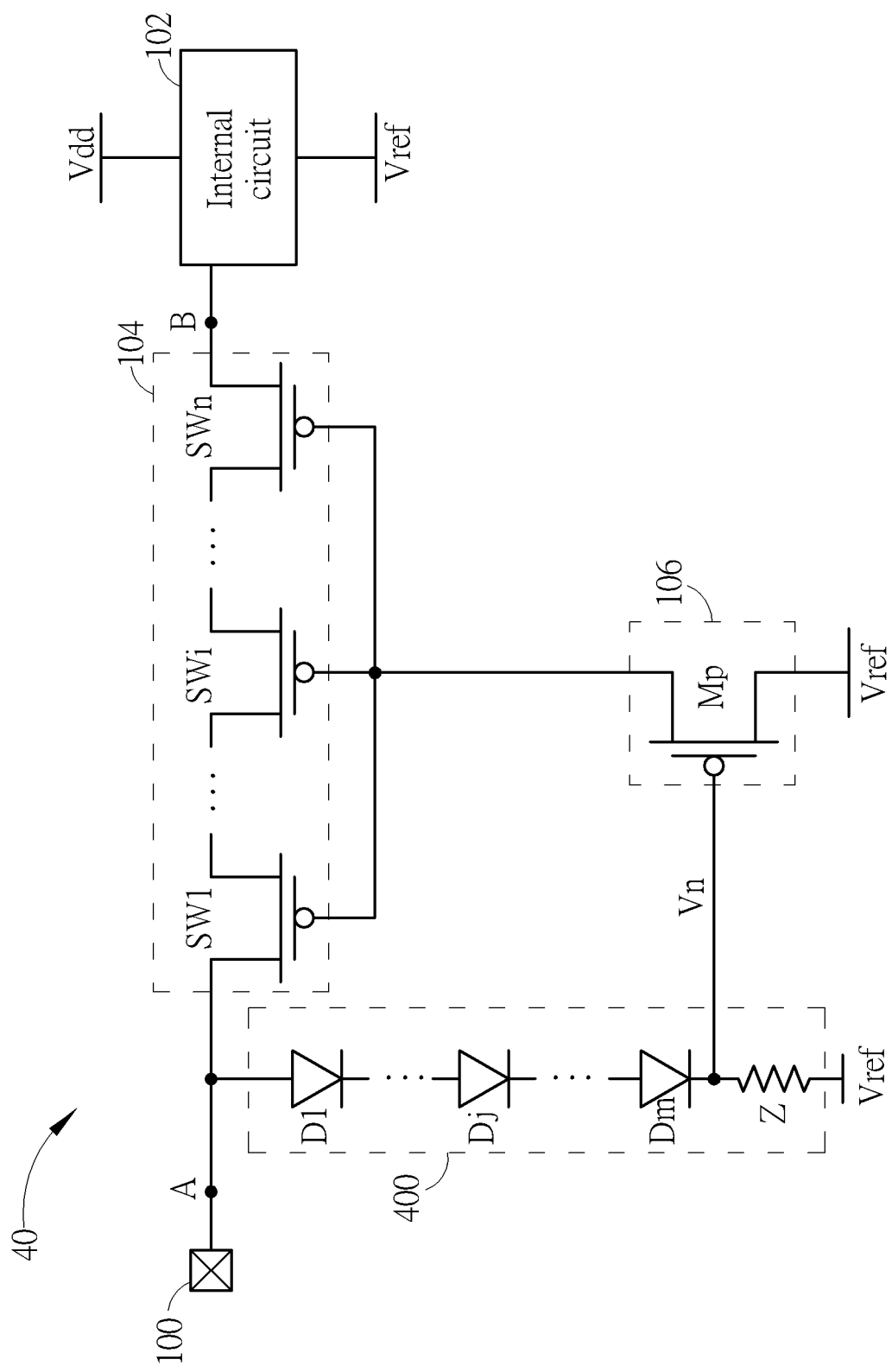
FIG. 4 is a schematic diagram of another IC according to an embodiment of the present invention.

On the other hand, please refer to FIG. 4, which is a schematic diagram of another IC 40 according to an embodiment of the present invention. The IC 40 is substantially similar to the IC 30 shown in FIG. 3, and therefore elements with similar structures and functions are denoted by the same symbols. Main difference between the IC 40 and the IC 30 is that the embodiment of FIG. 4 is described by taking the switch circuit 106 including a PMOS transistors Mp as an example. External connections of an ESD detection circuit 400 included in the IC 40 are similar to those of the ESD detection circuit 300, but the ESD detection circuit 400 includes different elements from those of the ESD detection circuit 300. In a case that the switch circuit 106 includes the PMOS transistors Mp, the ESD detection circuit 400 may include at least one diode and an impedance element Z. Notably, the number of the at least one diode is related to an operating voltage of the input signal. Furthermore, a total conduction voltage of the at least one diode may be designed to be greater than the operating voltage of the input signal during the normal mode. The impedance element Z may include an inductor and/or a resistor. In other words, the ESD detection circuit 400 is flexibly designed. The embodiment in FIG. 4 is described by taking the ESD detection circuit 400 including m diodes Dl-Dm and the impedance element Z including a resistor as an example. The m diodes Dl-Dm may form a stack structure. In detail, the diode Dj includes a first end coupled to the first end of the ESD detection circuit 400, and a second end coupled to the output end of the ESD detection circuit 400. The diode Dl includes a first end coupled to the first end of the ESD detection circuit 400, and a second end coupled to the first end of the diode Dj. The diode Dm includes a first end coupled to the second end of the diode Dj, and a second end coupled to the output end of the ESD detection circuit 400. The impedance element Z includes a first end coupled to the second end of the diode Dm and a second end coupled to the second end of the ESD detection circuit 400. Variables m and j are positive integers, and 1<j<m. However, when the ESD detection circuit 400 only includes the diode Dj and the impedance element Z, the first end of the impedance element Z is coupled to the second end of the diode Dj. First ends of the diodes Dl-Dm may be anodes, and second ends of the diodes Dl-Dm may be cathodes. In other embodiments, at least one diode-connected transistor(s) may replace at least one diode(s) Dl-Dm within the ESD detection circuit 400. Besides, in other embodiments, in a case that the internal circuit 102 itself includes at least one diode and an impedance element connected in series between the node A and the reference voltage terminal, the at least one diode and the impedance element of the internal circuit 102 may be utilized as an ESD detection circuit. That is, the control end of the switch circuit 106 is coupled to the internal circuit 102, and shares the at least one diode and the impedance element with other elements in the internal circuit 102, so that the at least one diode(s) Dl-Dm and the impedance element Z do not need to be additionally disposed outside of the internal circuit 102.

During the normal mode, the input signal comes from the signal pad 100 and passes the node A. Since the total conduction voltage of the diodes Dl-Dm is designed to be greater than the operating voltage of the input signal during the normal mode, that is to say, the voltage of the node A is less than the total conduction voltage of the diodes Dl-Dm. Therefore, the diodes Dl-Dm are cutoff as a whole, and thus the node voltage Vn is pulled down to be near the reference voltage Vref of the reference voltage terminal, so that an absolute value of a voltage difference between the node voltage Vn and a source voltage of the PMOS transistor Mp (or a source-gate voltage difference of the PMOS transistor Mp) is greater than an absolute value of a threshold voltage of the PMOS transistor Mp. Thus, the PMOS transistor Mp is conducted. As a result, the control ends of the switches SW1-SWn are electrically coupled to the reference voltage terminal with the reference voltage Vref and have a low voltage level, and the switches SW1-SWn are conducted accordingly, so that the variable impedance circuit 104 may provide the low impedance path between the signal pad 100 and the internal circuit 102. Under the ESD mode, the ESD signal comes from the signal pad 100 and passes the node A, the voltage of the node A is greater than the total conduction voltage of the diodes Dl-Dm. Therefore, the diodes Dl-Dm are conducted as a whole, and thus the node voltage Vn is regarded as the voltage of the node A minus the total conduction voltage of the diodes Dl-Dm, so that the absolute value of the voltage difference between the node voltage Vn and the source voltage of the PMOS transistor Mp (or the source-gate voltage difference of the PMOS transistor Mp) is smaller than the absolute value of the threshold voltage of the PMOS transistor Mp. Thus, the PMOS transistor Mp is cutoff. As a result, the control ends of the switches SW1-SWn are electrically floating, and the switches SW1-SWn are cutoff accordingly, so that the variable impedance circuit 104 provides the high impedance path between the signal pad 100 and the internal circuit 102.

Figure 5:
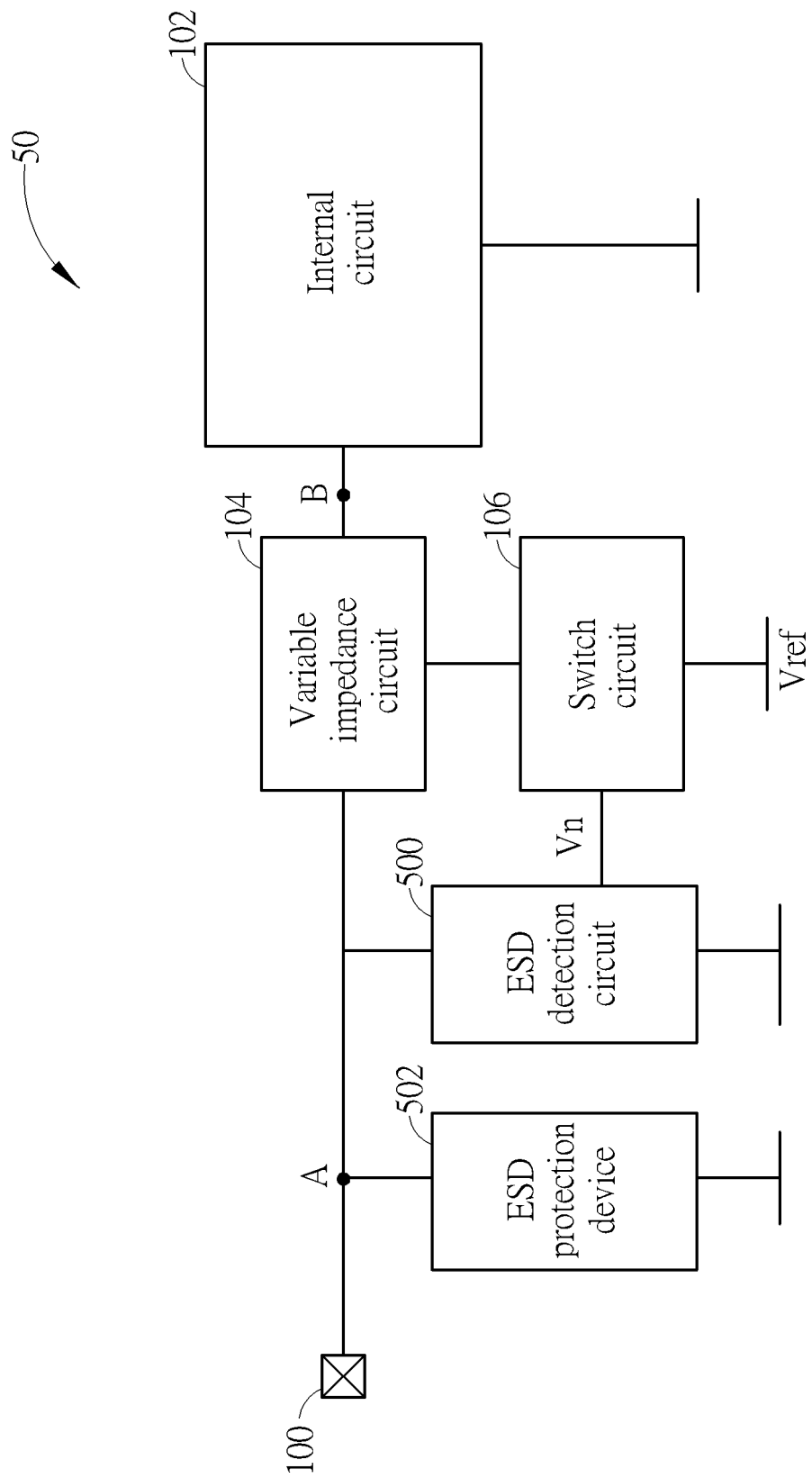
FIG. 5 is a schematic diagram of another IC according to an embodiment of the present invention.

Please refer to FIG. 5, which is a schematic diagram of another IC 50 according to an embodiment of the present invention. The IC 50 is substantially similar to the IC 10 shown in FIG. 1, and therefore elements with similar structures and functions are denoted by the same symbols. Main difference between the IC 50 and the IC 10 is that the IC 50 further includes an ESD detection circuit 500 and an ESD protection device 502. The ESD detecting circuit 500 may be implemented by the ESD detecting circuit 300 shown in FIG. 3 or the ESD detecting circuit 400 shown in FIG. 4, and is omitted herein for brevity. The ESD protection device 502 includes a first end coupled to the signal pad 100 (e.g., the first end of ESD protection device 502 is coupled between the signal pad 100 and a first end of the ESD detection circuit 500 or the first end of ESD protection device 502 is coupled to the node A), and a second end coupled to the reference voltage terminal. The ESD protection device 502 provision an ESD signal discharging path during the ESD mode. Furthermore, the ESD signal discharging path shunts the ESD signal to the reference voltage terminal, to weaken the ESD signal. In other words, under the ESD mode, the structure of the IC 50 not only shunts the ESD signal to the reference voltage terminal via the ESD protection device 502, but also makes the ESD signal difficult to directly enter the internal circuit 102 via the high impedance path provided by the variable impedance circuit 104 (e.g., the high impedance path is equivalent to provide the internal circuit 102 with additional tolerable capability of a voltage generated by conduction resistance of the ESD protection device 502 and the ESD signal, so as to block the ESD signal from entering the internal circuit 102). That is, the ESD protection device 502 and the variable impedance circuit 104 may provide the internal circuit 102 with double ESD protection mechanisms, which facilitates improving the ESD protection capability of the IC 50. It is noted that the above embodiment reduces the ESD signal entering the internal circuit 102 via the high impedance path provided by the variable impedance circuit 104 while the circuit size of the ESD protection device 502 may not be increased. Thus, compared with the conventional technology increasing the circuit size of the ESD protection device (e.g., increased to be 3 times the original circuit size), the variable impedance circuit 104 (e.g., with a circuit size 0.3 times the circuit size of the ESD protection device 502) and the ESD protection device 502 may have a smaller overall circuit area (e.g., with a circuit size 1.3 times the circuit size of the ESD protection device 502), and have relatively small parasitic capacitance. In other embodiments, the ESD detecting circuit 500 may not be additionally disposed, and the control end of the switch circuit 106 is coupled to the internal circuit 102, so that the node voltage Vn is related to whether the internal circuit 102 is in a power on status or a power off status, or the node voltage Vn may be provided by components in the internal circuit 102. In addition, the node voltage Vn may also be provided by other circuits.

Figure 6:
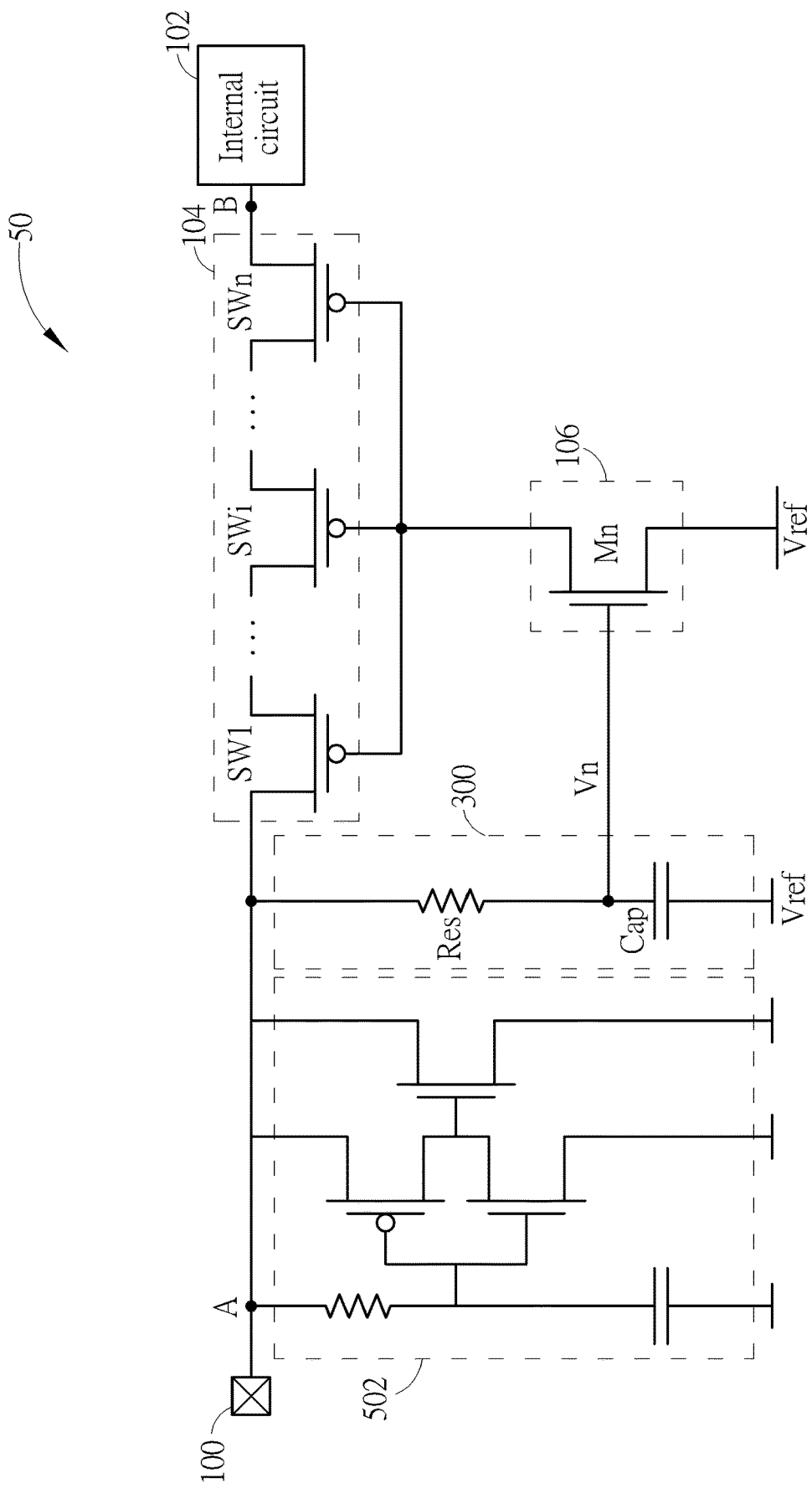
FIG. 6 is a schematic diagram of circuits of the IC shown in FIG. 5 according to an embodiment of the present invention.
Figure 7:
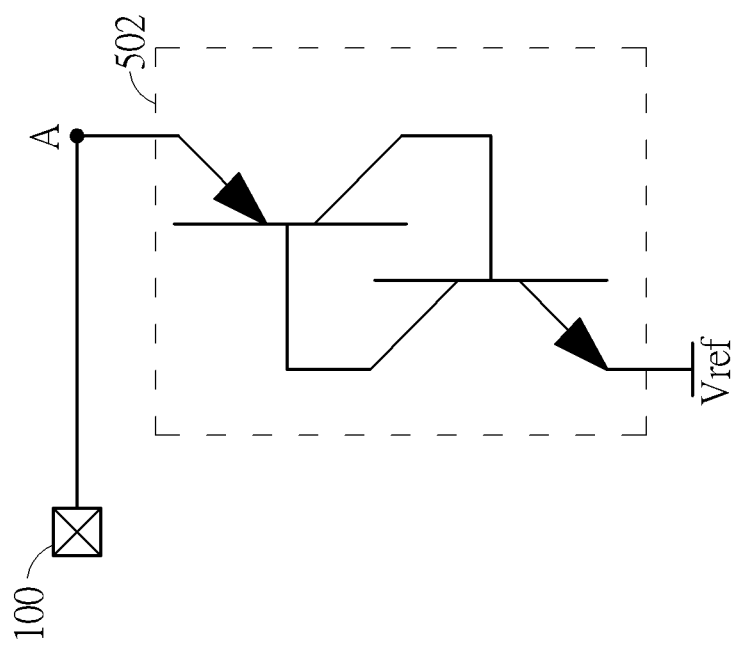
FIG. 7 to FIG. 10 are schematic diagrams of alterations of an ESD protection device shown in FIG. 6 according to embodiments of the present invention.
Figure 8:
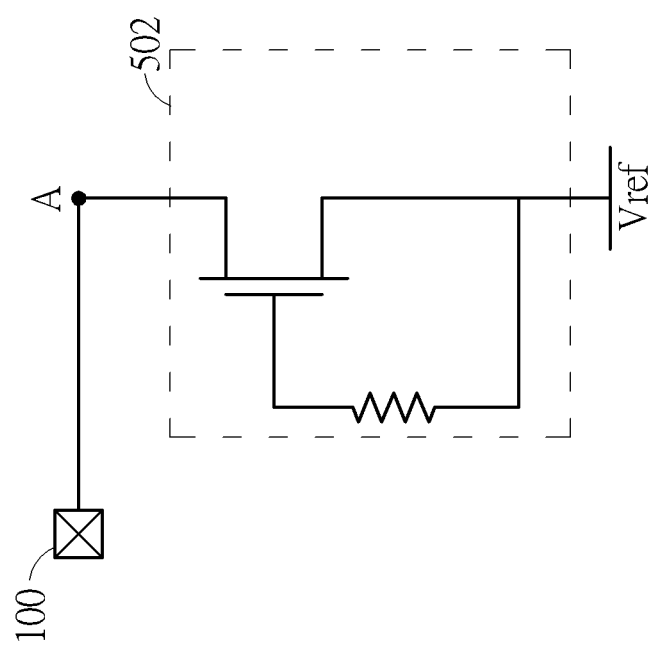
Figure 9:
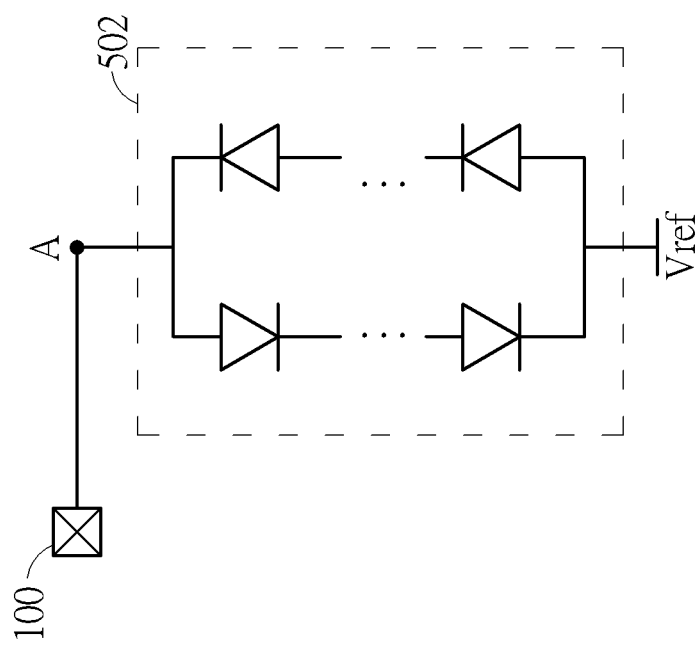
Figure 10:
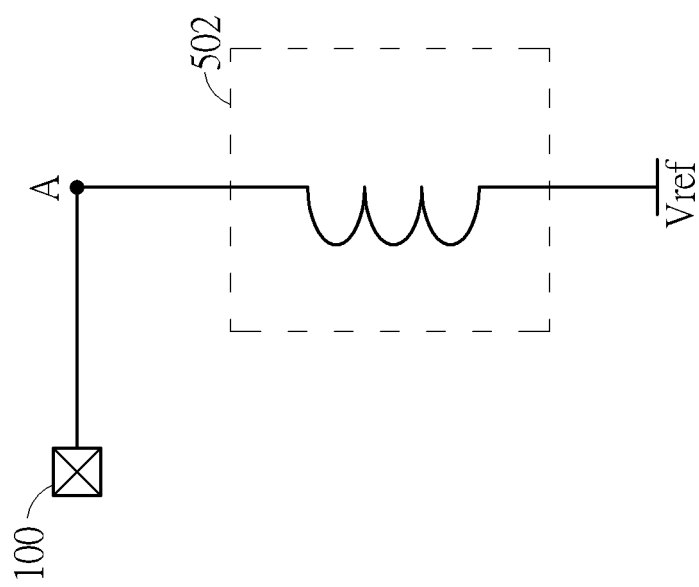

In detail, please refer to FIG. 6, which is a schematic diagram of circuits of the IC 50 shown in FIG. 5 according to an embodiment of the present invention. The IC 50 shown in FIG. 6 is substantially similar to the IC 30 shown in FIG. 3, and therefore elements with similar structures and functions are denoted by the same symbols. Main difference between the IC 50 and the IC 30 is that the IC 50 further includes the ESD protection device 502, and the ESD protection device 502 is realized by a structure of a resistor, a capacitor, an inverter and an NMOS transistor. In the ESD mode, the resistor, the capacitor and the inverter control the NMOS transistor to be conducted, to provide the ESD signal discharging path. Operation of the ESD protection device 502 of FIG. 6 is known by those skilled in the art, and will not be narrated here for brevity. In addition, please refer to FIG. 7 to FIG. 10, which are schematic diagrams of alterations of the ESD protection device 502 shown in FIG. 6 according to embodiments of the present invention. As shown in FIG. 7 to FIG. 10, the circuit structure of the ESD protection device 502 may be implemented by a silicon controlled rectifier (SCR) structure, a MOS transistor structure, a diode structure and an inductor, respectively, to provide the ESD signal discharging path during the ESD mode. Operations of the circuits shown in FIG. 7 to FIG. 10 are known by those skilled in the art, and are not be narrated here for brevity.

In summary, the present invention may properly design circuitry to form the low impedance path during the normal mode, so that the internal circuit may receive and process the input signal normally, and operations of the internal circuit are not affected. Besides, the present invention may form the high impedance path during the ESD mode, to reduce the impact of the ESD signal on the internal circuit. In addition, the present invention may properly design the circuit size of the variable impedance circuit (e.g. by designing the number of switches included in the variable impedance circuit and selecting switches with proper sizes), to have smaller circuit area and parasitic capacitance. As a result, the present invention provides a simpler design and more flexibility, and lower production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit (IC) with electrostatic discharge (ESD) protection, comprising:
   a signal pad, configured to receive an input signal during a normal mode, and receive an ESD signal during an ESD mode;
   an internal circuit, configured to process the input signal during the normal mode;
   a variable impedance circuit, comprising a first end coupled to the signal pad, a second end coupled to the internal circuit, and a control end, wherein the variable impedance circuit provides a low impedance path between the signal pad and the internal circuit during the normal mode, and provides a high impedance path between the signal pad and the internal circuit during the ESD mode; and
   a switch circuit, comprising a first end coupled to the control end of the variable impedance circuit, a second end coupled to a reference voltage terminal, and a control end configured to receive a node voltage, wherein the switch circuit is configured to switch the control end of the variable impedance circuit to have a first specific voltage during the normal mode, and to switch the control end of the variable impedance circuit to be electrically floating during the ESD mode.

2. The integrated circuit of claim 1, wherein during the normal mode, an absolute value of a voltage difference between the node voltage and a voltage of the first end or the second end of the switch circuit is greater than an absolute value of a threshold voltage of the switch circuit to switch the switch circuit to be conducted.

3. The integrated circuit of claim 2, wherein the control end of the variable impedance circuit is electrically coupled to the reference voltage terminal to have the first specific voltage.

4. The integrated circuit of claim 1, wherein during the ESD mode, an absolute value of a voltage difference between the node voltage and a voltage of the first end or the second end of the switch circuit is smaller than an absolute value of a threshold voltage of the switch circuit to switch the switch circuit to be cutoff.

5. The integrated circuit of claim 4, wherein the node voltage has a floating voltage.

6. The integrated circuit of claim 1, wherein the control end of the switch circuit is coupled to the internal circuit, and the node voltage is related to whether the internal circuit is in a power on status or a power off status.

7. The integrated circuit of claim 6, wherein
   the internal circuit is in the power on status, to switch the node voltage to have a second specific voltage during the normal mode; and
   the internal circuit is in the power off status, to switch the node voltage to have a floating voltage during the ESD mode.

8. The integrated circuit of claim 1 further comprising:
   a first ESD detection circuit, configured to generate the node voltage according to the input signal or the ESD signal.

9. The integrated circuit of claim 8, wherein the first ESD detection circuit comprises a first end coupled between the signal pad and the first end of the variable impedance circuit, a second end coupled to the reference voltage terminal, and an output end coupled to the control end of the switch circuit and configured to output the node voltage.

10. The integrated circuit of claim 9, wherein the switch circuit comprises a p-channel metal oxide semiconductor (PMOS) transistor, and the first ESD detection circuit comprises:
    at least one first diode, comprising a first end coupled to the first end of the first ESD detection circuit, and a second end coupled to the output end of the first ESD detection circuit; and a first impedance element, comprising a first end coupled to the second end of the at least one first diode, and a second end coupled to the second end of the first ESD detection circuit.

11. The integrated circuit of claim 9, wherein the switch circuit comprises an N-channel metal oxide semiconductor (NMOS) transistor, and the first ESD detection circuit further comprises:
- a first resistor, comprising a first end coupled to the first end of the first ESD detection circuit, and a second end coupled to the output end of the first ESD detection circuit; and
- a first capacitor comprising a first end coupled to the second end of the first resistor, and a second end coupled to the second end of the first ESD detection circuit.

12. The integrated circuit of claim 11, wherein a time constant of the first resistor and the first capacitor is greater than a pulse width of the ESD signal and smaller than a switching time of the input signal.

13. The integrated circuit of claim 1, wherein the variable impedance circuit comprises at least one switch, and a first switch of the at least one switch comprises a first end coupled to the first end of the variable impedance circuit, a second end coupled to the second end of the variable impedance circuit, and a control end coupled to the control end of the variable impedance circuit.

14. The integrated circuit of claim 13, wherein a second switch of the at least one switch comprises a first end coupled to the second end of the first switch, a second end coupled to the second end of the variable impedance circuit, and a control end coupled to the control end of the variable impedance circuit.

15. The integrated circuit of claim 13, wherein the first switch comprises a PMOS transistor, a P-channel field effect transistor (PFET) or a pseudomorphic high electron mobility transistor (pHEMT).

16. The integrated circuit of claim 15, wherein the switch circuit comprises a PMOS transistor or an NMOS transistor.

17. The integrated circuit of claim 16 further comprising:
- a second ESD detection circuit, comprising a first end coupled between the signal pad and the first end of the variable impedance circuit, a second end coupled to the reference voltage terminal, and an output end coupled to the control end of the switch circuit and configured to output the node voltage.

18. The integrated circuit of claim 17, wherein the switch circuit comprises the PMOS transistor, and the second ESD detection circuit comprises:
- at least one second diode, comprising a first end coupled to the first end of the second ESD detection circuit, and a second end coupled to the output end of the second ESD detection circuit; and
- a second impedance element, comprising a first end coupled to the second end of the at least one second diode, and a second end coupled to the second end of the second ESD detection circuit.

19. The integrated circuit of claim 17, wherein the switch circuit comprises the NMOS transistor, and the second ESD detection circuit further comprises:
- a second resistor, comprising a first end coupled to the first end of the second ESD detection circuit, and a second end coupled to the output end of the second ESD detection circuit; and
- a second capacitor, comprising a first end coupled to the second end of the second resistor, and a second end coupled to the second end of the second ESD detection circuit.

20. The integrated circuit of claim 17 further comprising:
- an ESD protection device, comprising a first end coupled between the signal pad and the first end of the second ESD detection circuit, and a second end coupled to the reference voltage terminal, the ESD protection device configured to provide an ESD signal discharging path during the ESD mode.

* * * * *